INVENTOR.
RONALD N. CLARKE,
By HIS ATTORNEYS
Spensley & Horn.

INVENTOR
RONALD N. CLARKE,
By His Attorneys
Spensley & Horn.

United States Patent Office 3,452,256

Patented June 24, 1969

3,452,256
HIGH FREQUENCY MULTI-CELL TRANSISTOR STRUCTURE

Ronald N. Clarke, Canoga Park, Calif., assignor to TRW Semiconductors, Inc., Lawndale, Calif., a corporation of Delaware Filed Sept. 20, 1967, Ser. No. 669,093
Int. Cl. H01l 11/00, 15/00
U.S. Cl. 317—235 4 Claims

ABSTRACT OF THE DISCLOSURE

A multiple-cell coplanar transistor structure formed in a single semiconductor crystal body, the bulk of the semiconductor material forming a common electrode with the remaining electrodes being formed by a predetermined pattern of diffused regions in the upper surface of the crystal, thereby defining a plurality of transistor cells. Circular groups of cells are equidistantly spaced on the circumference of a larger circle, electroconductive interconnecting lines extending from each cell to the center of its group and then to the center of the large circle to provide identical interconnecting lead lengths.

BACKGROUND OF THE INVENTION

The parallel connection of identical electrical translating elements is a common technique for increasing the power handling capabilities of an electronic circuit. for example, the power output of a transistor amplifier stage may be increased by adding one or more transistors in shunt with a given transistor. Although commonly used in low and intermediate frequency applications, this technique has heretofore proven quite difficult of application at high frequencies due to various phenomenon. In circuitry operating at radio frequencies on the order of 70 to 1,000 megacycles or greater, the lengths of the electrical interconnecting leads in the circuit approach the operating wavelength, thereby resulting in significant differences in the resistance of various circuit paths. For example, it has been found that in high frequency applications involving parallel connected transistors slight differences in the configuration of the transistor base or emitter leads may result in one transistor carrying practically all of the current, while the other parallel connected transistors are literally inoperative. This phenomenon is known as "current hogging."

In an effort to overcome current hogging at high frequencies various multi-cell transistor geometries have been developed to provide identical input (base or emitter) lead configurations, the multi-cell structure enabling determination of the device power handling capabilities by selecting the number of cells to be connected in parallel, and convenient replacement of defective components by connecting an unused cell in place of a defective one. However, the prior art multi-cell transistor geometries are not without their attendant disadvantages, earlier structures being characterized by severely limited thermal dissipation characteristics. Subsequently developed structures achieved better thermal characteristics by utilizing an annular metalizing pattern for cell interconnection. However, the metalizing parasitics of such prior art annular geometries have posed serious problems, these metalizing parasitics being proportional to the radius of the circle.

SUMMARY OF THE INVENTION

The present invention is directed toward an improved geometry for a multi-cell high frequency transistor structure formed in a single body of semiconductor material, the bulk of the semiconductor material forming a common electrode for the transistors with the remaining electrodes of each transistor being diffused into the upper surface of the semiconductor body to thereby form a plurality of individual transistor cells, the present invention geometry being characterized by high thermal dissipating capabilities and significantly reduced metalizing parasitics. The present invention geometry comprises a pattern consisting of $n$ identical groups of transistor cells equidistantly spaced on the circumference of a large circle, each group in turn consisting of $n$ identical transistor cells equidistantly spaced on the circumference of a small circle, where $n$ is an integer and where the circumference of each of the small circles equals the circumference of the large circle divided by $n$. The improved annular geometry of the present invention provides a reduction of the radius by $1/n$ for $n$ circles, these circles then being paralleled for a further $1/n$ reduction in the parasitics. Furthermore, this reduction enables doubling of the length of the uninterrupted linear interconnecting pattern, thereby reducing the parasitics by $(n+1/n^2)$. The present invention uninterrupted structure allows a full 360° thermal dissipation pattern to provide the device with an extremely low thermal resistance characteristic. Theoretically, the present invention transistor cell geometry significantly reduced the degrading metalizing parasitics in a power pattern allowing retention of the high crystal gain.

Accordingly, it is an object of the present invention to provide an improved transistor structure.

It is also an object of the present invention to provide an improved multiple-cell transistor structure.

It is another object of the present invention to provide an improved multiple-cell transistor structure geometry.

It is a further object of the present invention to provide an improved multiple-cell transistor structure characterized by low parasitics.

It is yet another object of the present invention to provide an improved multiple-cell transistor annular geometry characterized by low metalizing parasitics.

It is a still further object of the present invention to provide an improved multiple-cell transistor geometry characterized by high thermal dissipation capabilities.

The novel features which are believed to be characteristic of the present invention, together with further objects and advantages thereof, will be better understood from the following description considered in connection with the accompanying drawing illustrating the novel geometry. It is to be expressly understood, however, that the description is for the purpose of illustration only and that the true spirit and scope of the invention is defined by the acocmpanying claims

DESCRIPTION OF THE PREFERRED EMBODIMENT

Figure 1:
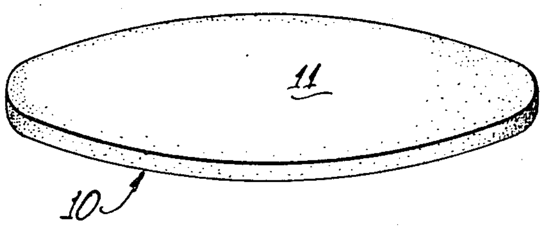
FIGURE 1 is a perspective view of a portion of a semiconductor wafer.

Turning now to the drawing, in FIGURE 1 there is shown a portion of a semiconductor starting crystal wafer, generally indicated by the reference numeral 10, suitable for use in fabricating the present invention multi-cell transistor structure. The crystal wafer 10 is of a predetermined conductivity type material, such as N type silicon, for example. The wafer 10 has a planar upper surface 11 into predetermined areas of which are introduced active impurity atoms in accordance with well known masking and diffusion techniques.

Figures 2, 3:
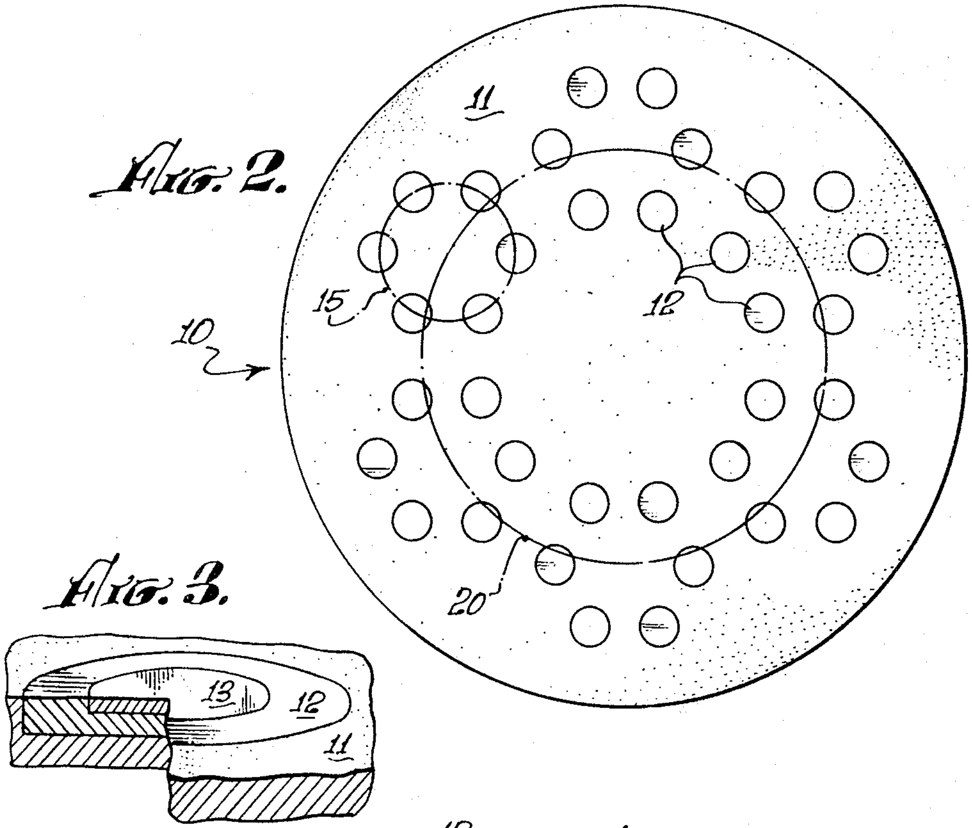
FIGURE 2 is an enlarged plan view of that portion of the wafer of FIGURE 1, during an early stage of the fabrication of a multiple-cell transistor structure in accordance with the present invention.
FIGURE 3 is an enlarged perspective view, partially cut away, of one of the individual transistor cells during a later stage of fabrication.

First, a plurality of circular P type base surface regions 12 are diffused into the upper surface of the wafer in a precise geometrical pattern wherein the regions are arranged in six circular groups of six regions per group, the groups in turn being arranged in a circular array as shown in the plan view of FIGURE 2. The six regions 12 forming each group are equidistantly spaced on the circumference of a small circle indicated by a dashed line 15, each of the six groups being equidistantly spaced on the circumference of a large circle indicated by an interrupted line 20, the small circle 15 having a diameter one-ninth of the diameter of the large circle 20. The interfaces between the P type surface regions 12 and the surrounding N type bulb material form PN junctions.

Upon establishing the geometrical pattern of P type base surface regions shown in FIGURE 2, a N type emitter surface region 13 is then diffused into each one of the P type base regions 12, the surface regions 13 being island type regions which are completely surrounded by the P type regions 12. The diffusion depth of the surface regions 13 is not as deep as those of the surface regions 12, as can be seen in FIGURE 3 of the drawing, whereby the surface regions 13 are completely contained within the surface regions 12. Thus, a series of thirty-six transistor "cells" are formed, the N type bulk material of the wafer 10 providing a common transistor collector electrode. All of the surface regions 12 are formed by a single diffusion process, as are all of the surface regions 13, whereby all of the cells have identical electrical characteristics.

In accordance with the present invention concepts, the geometrical pattern of transistor cells consists of $n$ groups of cells with the groups being equidistantly spaced on the circumference $c$ of a circle, each group consisting of $n$ cells equidistantly spaced on a circle of $c/n$ circumference. Thus, in the illustrated embodiment $n=6$ and the circumference of the circle 15 is one-sixth the circumference of the circle 20. $n$ can be any integer greater than 1, and it is preferable to set $n$ as large as possible in accordance with available space and allowable crystal size.

Figure 4:
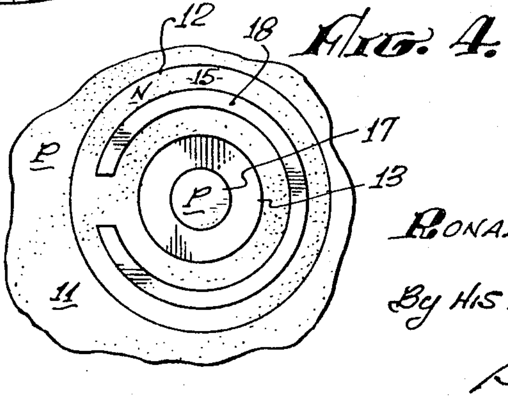
FIGURE 4 is a plan view of the cell of FIGURE 3 during a subsequent stage of fabrication.

Then, a coating 15 of electrical insulating material, such as a sterile oxide film, for example, is established on the wafer 10, completely covering the upper surfaces 11, 12 and 13. In accordance with well known masking and etching techniques, certain portions of the oxide coating 15 are removed to expose predetermined portions of the surface regions 12 and 13, as indicated in FIGURE 4. In the illustrated embodiment a central circular portion 17 of each of the N type surface regions 13 is exposed, and an intermediate arcuate strip portion 18 of each P type region 12. Each of the arcuate portions 18 is almost a complete circle, a small gap being left to provide for electrical connection to the central exposed portion 17, as will be hereinbelow explained. The gap defined between the opposing ends of each arcuate strip portion 18 faces the center of the circle on which the cells of that particular group are arranged. In this manner, none of the PN junctions are exposed and electrical contact to the various surface regions in each cell is facilitated.

Next, a film of electroconductive material is established in a predetermined pattern upon the oxide coating 15 and covering the exposed surface portions of the underlying semiconductor wafer. This electroconductive pattern may be formed by any metalizing technique, the predetermined pattern defining two separate electrical contact configurations, one providing contact to the central portion 17 of each of the N type emitter regions 13 and the other providing contact to the arcuate portion 18 of each of the P type base regions 12.

Figure 5:
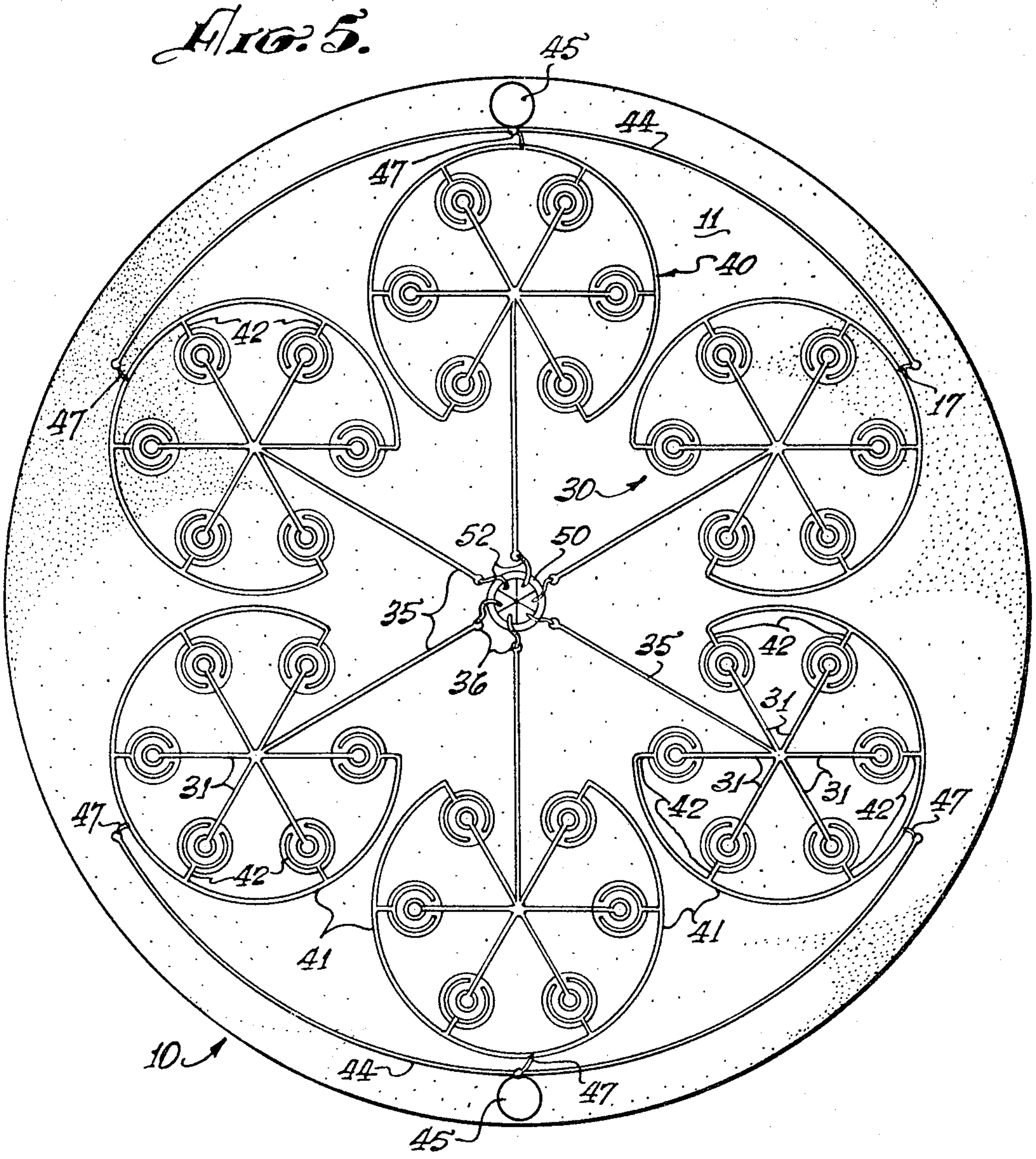
FIGURE 5 is an enlarged plan view of the completed device.

The electroconductive pattern configuration for establishing connection to the central portion 17 of the N type surface regions 13 is generally indicated by the reference numeral 30, the electroconductive pattern configuration for establishing connection to the arcuate portion 18 of the P type surface regions 12 being generally indicated by the reference numeral 40. These pattern configurations can best be described with reference to FIGURE 5 of the drawing.

The contact pattern configuration 30 defines a plurality of linear interconnecting portions 31 extending radially outward from the center of each of the circles 15, through the gap of arcuate portion 18 and over the central portion 17 of each transistor cell in the circular grouping, not unlike the spokes of a wheel, the metal filling the openings in the oxide coating 15 to thereby establish ohmic contact to the semiconductor N type surface region 13. The contact pattern configuration 30 further defines a linear portion 35 extending from the center of each circle 15 radially inwardly toward the center of the circle 20 and terminating in a slightly enlarged contact end portion 36.

At the center of the circle 20 there is provided a circular metalized emitter contact 50 to serve as an electrical terminal for connecting the transistor emitter to external circuitry. The contact end portions 36 are spaced about the periphery of the central emitter contact 50 for connection thereto by lead bonds 52. In the illustrated embodiment, the N type emitter regions 13 of all of the cell groups are connected to the central contact 50 by lead bonds 52, i.e., all six of the cell groups are shown connected for use. If less than all six groups are desired to be used, it is merely necessary to omit the lead bonds 52 from the linear interconnecting "spokes" 35 of that group and the central emitter contact 50.

The contact pattern configuration 40 defines six first arcuate portions 41, one for each cell group and extending from a cell nearest the center of the circle around the group to the adjacent cell. Extending radially inward from each first arcuate portion 41 are six interconnecting portions 42, one for each cell of the group. Each interconnecting portion 42 comprises a linear strip extending from the associated arcuate portion 41 to the arcuate portion 18 of the adjacent cell, covering the opening in the oxide coating 15 and filling the opening to thereby establish ohmic contact with the exposed portion of the P type base region 12. The contact pattern configuration 40 further defines two second arcuate portions 44, each being concentric with the circle 20 and extending partially around three adjacent cell groups. Each of the arcuate portions 44 is provided at its mid-point with an enlarged base contact area 45 to serve as an electrical terminal for connecting the transistor base to external circuitry. The P type surface regions of each of the cell groups are connected to the contact areas 45 by means of lead bonds 47 connected between the first arcuate portions 41 and the second arcuate portions 44, all six of the cell groups being shown connected in the illustrated embodiment.

Thus, the illustrated embodiment shows a high frequency transistor composed of thirty-six parallel-connected transistor cells (six groups of six cells per group). The emitter contact 50 is connected by jumper leads 52 to the emitter interconnection pattern 30, which is in ohmic contact with each of the N type surface regions 13 and is electrically insulated from the P type surface regions 12 and the remainder of the semiconductor wafer by the oxide coating 15, and from the base interconnection pattern 40 by physical spacing. Although, as a matter of convenience, the base and emitter interconnection patterns 30 and 40, and the contacts 50 and 45, can be formed by one metalizing operation, these patterns and contacts can be formed by a series of separate metalizing operations.

External electrical connection to the parallel connected emitter electrodes is made by bonding an emitter lead to the central disk contact 50, external base connection being established by bonding base leads to the contacts 45 of the base pattern. External connection to the collector electrode can be made conveniently to the bottom surface of the semiconductor wafer 10, the bottom surface being metalized to facilitate low resistance ohmic contact thereto.

The arrangement of the linear interconnecting portions 31 and 35 of the emitter interconnection pattern 30 insures an exactly identical, minimum emitter lead length for each of the transistor cells. Thus, both the DC and RF signals are fed uniformly to each cell through the use of this symmetrical emitter interconnection pattern, and each cell draws the same amount of current. The illustrated embodiment is designed for identical emitter lead lengths, and it is readily apparent that the present invention concepts are equally applicable for use with the same interconnection pattern geometry to provide identical base lead lengths merely by reorientation of the arcuate openings through the oxide layer so that the gaps face radially outwards toward the arcuate portions 41 of the interconnecting pattern, which then becomes the emitter interconnecting pattern.

Thus, although the present invention has been described with a certain degree of particularity, it is understood that the present disclosure has been made only by way of example and that numerous changes in the combination and arrangement of parts may be resorted to without departing from the spirit and scope of the invention as hereinafter claimed. For example, the present invention technique is equally applicable in the fabrication of other types of multiple cell semiconductor devices wherein the cells are interconnected in parallel.

What is claimed is:

1. In a high frequency semiconductor device:

(a) a semiconductor body of a first predetermined conductivity type defining a substantially planar surface;

(b) a plurality of substantially identical circular groups of first surface regions of a second predetermined conductivity type in said planar surface of said semiconductor body, said groups being equidistantly disposed along the circumference of a first circle, the plurality of said first surface regions comprising each of said groups being equidistantly disposed along the circumference of a second circle, said second circle being smaller than said first circle;

(c) a plurality of substantially identical second surface regions of said first predetermined conductivity type, one each of said second surface regions being disposed within a different one of said first surface regions, the depth of each of said second surface regions being less than the depth of the first surface regions within which it is disposed;

(d) a layer of electrical insulating material established on said planar surface of said semiconductor body and exposing identical portions of said second surface regions;

(e) a thin layer of electroconductive material established in a predetermined pattern on said layer of electrical insulating material, said predetermined pattern defining a plurality of elongate first portions of substantially identical length within each of said smaller second circles, the elongate first portions within each of said smaller second circles being symmetrically arranged in radial alignment to define an array of electroconductive strips extending from the center of the circle to each of the exposed portions of said second surface region to establish ohmic contact therewith, a disc shaped second portion at the center of said larger first circle, and a plurality of elongate third portions of identical length symmetrically arranged in radial alignment about the center of said larger first circle and extending from the center of each of said smaller second circles almost to the disc shaped second portion at the center of said larger first circle;

(f) means for establishing electrical contact to the central disc shaped second portion of said layer of electroconductive material; and (g) means for electrically connecting said disc shaped second portion to the adjacent innermost ends of desired ones of said third portions.

2. In a high frequency semiconductor device as defined in claim 1, wherein said plurality of groups of first surface regions is an integer *n*, wherein said first circle has a circumference *c*, and wherein the circumference of each of said second circles is equal to $c/n$.

3. In a transistor:

(a) a semiconductor body of a first predetermined conductivity type defining a substantially planar surface;

(b) a plurality of substantially identical groups of first planar diffused regions of a second predetermined conductivity type in said planar surface of said semiconductor body, said groups being substantially equidistantly disposed along the circumference of a first circle, said second circle the plurality of said first regions comprising each of said groups being equidistantly disposed along the circumference of a second circle, being smaller than said first circle;

(c) a plurality of substantially identical second surface regions of said first predetermined conductivity type, one each of said second surface regions being disposed within a different one of said first surface regions, the depth of each of said second surface regions being less than the depth of the first surface regions within which it is disposed;

(d) a layer of electrical insulating material established on said planar surface of said semiconductor body and exposing portions of said second surface regions;

(e) a thin layer of electroconductive material established in a predetermined pattern on said layer of electrical insulating material, said predetermined pattern defining a plurality of elongate first portions of substantially identical length within each of said smaller second circles, the elongate first portions within each of said smaller second circles being symmetrically arranged in radial alignment to define an array of electroconductive strips extending from the center of the circle to each of the exposed portions of said second surface region to establish ohmic contact therewith, a disc shaped second portion at the center of said larger first circle, and a plurality of elongate third portions of identical length symmetrically arranged in radial alignment about the center of said larger first circle and extending from the center of each of said smaller second circles almost to the disc shaped second portion at the center of said larger first circle;

(f) means for establishing electrical contact to the central disc shaped second portion of said layer of electroconductive material; and (g) means for electrically connecting said disc shaped second portion to the adjacent innermost ends of desired ones of said third portions.

4. In a transistor as defined in claim 3, wherein said plurality of groups of first surface regions is an integer *n*, wherein said first circle has a circumference *c*, and wherein the circumference of each of said second circles is equal to *c*/*n*.

References Cited

UNITED STATES PATENTS

| | | | |
|---|---|---|---|
| 3,225,261 | 12/1965 | Wolf ------------ | 317—235 X |
| 3,287,610 | 11/1966 | Reber ------------- | 317—234 |
| 3,336,508 | 8/1967 | Preletz et al. ------ | 317—235 X |

JOHN W. HUCKERT, *Primary Examiner.*

J. R. SHEWMAKER, *Assistant Examiner.*